United States Patent
Chen

[11] Patent Number: 6,130,129
[45] Date of Patent: Oct. 10, 2000

[54] METHOD OF MAKING SELF-ALIGNED STACKED GATE FLUSH MEMORY WITH HIGH CONTROL GATE TO FLOATING GATE COUPLING RATIO

[75] Inventor: Bin-Shing Chen, Hsinchu, Taiwan

[73] Assignee: Winbond Electronics Corp., Hsinchu, Taiwan

[21] Appl. No.: 09/113,020

[22] Filed: Jul. 9, 1998

[51] Int. Cl.[7] .................................................. H01L 21/336
[52] U.S. Cl. ...................... 438/257; 438/258; 438/259; 438/266; 438/267; 438/296; 257/315; 257/316
[58] Field of Search .................................. 438/257, 258, 438/259, 266, 267, 296; 257/315, 316

[56] References Cited

U.S. PATENT DOCUMENTS 5,923,974  7/1999  Liang et al. ............................ 438/257

*Primary Examiner*—David Nelms
*Assistant Examiner*—Quoc Hoang
*Attorney, Agent, or Firm*—W. Wayne Liauh

[57] ABSTRACT

An improved process for fabricating flash memory cells with high control-gate-to-floating-gate coupling ratio is disclosed. The flash memory cell contains: (a) a substrate; (b) at least a pair of spaced-apart floating gates on the substrate, each of the floating gate has a pair of poly sidewall spacers; (c) a field oxide layer (FOX) partially recessed into the substrate; (d) an oxide/nitride/oxide (ONO) layer covering each of the floating gates; (e) a control gate covering the oxide/nitride/oxide layer and the field oxide layer. The design of the flash memory cell allows the field oxide layer to be wedged between the pair of floating gates and below the poly sidewall spacers. The poly sidewall spacers substantially increases the overlapping area between the control gate and the floating gate, thus allowing the control-gate-to-floating-gate coupling ratio and the performance of the flash memory to be enhanced. Also, since the field oxide layer and the floating gates are self-aligned, high density flash memory can be made from this process. Furthermore, the distance between the floating gates can be shorter than that limited by the underlying photolithography technology.

16 Claims, 3 Drawing Sheets

METHOD OF MAKING SELF-ALIGNED STACKED GATE FLUSH MEMORY WITH HIGH CONTROL GATE TO FLOATING GATE COUPLING RATIO

FIELD OF THE INVENTION

The present invention relates to a novel method for making self-aligned stacked-gate flash memory with high control-gate-to-floating-gate coupling ratio, and the improved stacked-gate flash memory fabricated therefrom. More specifically, the present invention relates to an improved stacked-gate flash memory with high control-gate-to-floating-gate coupling ratio which is achieved by increasing the overlapping area between the control gate floating gate, and the method of fabricating such improved flush memories. The method disclosed in the present invention allows the floating gates to be self-aligned with the field oxide layer (FOX) without sacrificing control-gate-to-floating-gate coupling ratio, and the flash memories fabricated by the method of the present invention are most advantageous for use in low voltage applications.

BACKGROUND OF THE INVENTION

Because of its highly reduced weight and physical dimension compared to magnetic memories such as hard disk or floppy disk memories, flash memory has a tremendous potential in the consumers electronics market. Flash memories are high-density nonvolatile semiconductor memories offering fast access times. Compared to other nonvolatile semiconductor memories such as conventional EPROMs or EEPROMs, flash memories are most suitable for applications wherein there are expected frequent write and read operations. With the rapid growth of digital cameras and the desire for light-weight notebook PCs, the demand for even higher density flash memories is ever increasing.

In a typical flash memory operation, the gate electrode comprises a control gate and one or more floating gates separated by a thin dielectric layer. When the control gate is charged, hot electrons will travel across the thin dielectric layer and cause the floating gate to be charged. After the power is turned off, the oxide layer surrounding the floating gate prevents the charge from dissipated. The control-gate-to-floating-gate coupling ratio, which is related to the areal overlap between control gate and the floating gate, affects the read/write speed of the flash memory.

U.S. Pat. No. 5,506,160, the content thereof is incorporated herein by reference, discloses a self-aligned trench isolation scheme for achieving 0.8 μm isolation spacing between the MOS select transistors in an alternate metal virtual ground (AMG) EPROM array. The '160 also discloses a detailed process to implement an N⁻ source for the EPROM cells and trench isolation between select transistors. The inventors claimed that using their process, both poly topography and bit line/word line capacitance can be significantly reduced. In addition, a new poly stack self-aligned etch (SAE) scheme is presented which allows better poly2 critical dimension control and eliminate poly1 bridging. As a result, word line to word line spacing of an AMG EPROM array can be scaled down to 0.6 μm and below to achieve 64 Mbit EPROM array.

U.S. Pat. No. 5,409,854, the content thereof is incorporated herein by reference, discloses a floating gate of a virtual-ground flash EPROM cell, which is formed over a portion of a pair of vertically-adjacent field oxide regions, is self-aligned to the field oxide regions by utilizing a stacked etch process to define the widths of both the floating gate and the field oxide regions. The inventor claimed that, as a result, the pitch of the cells in the X-direction can be substantially reduced.

While the above inventions might have offered some advantages in the manufacturing of flash memories, neither of them addressed the issue of how to improve the coupling efficiency between the floating gate and the control gate. Increased coupling ratio can be very beneficial in reducing the required operation voltage of memory cell. Because of the increasing importance of flash memories in consumer goods, it is important that substantial research and development efforts be devoted in this area so as to further improve the performance and quality of flash memory cells, especially for low-voltage operations.

SUMMARY OF THE INVENTION

The primary object of the present invention is to develop a method to fabricate flash memory cells with improved control-gate-to-floating-gate coupling ratio, and the improved flash memory cells fabricated therefrom. More specifically, the primary object of the present invention is to develop an improved flash memory with increased overlapping area between control gate and floating gate so as to enhance the control-gate-to-floating-gate coupling ratio and thus the performance of the flash memory. The increased control-gate-to-floating-gate coupling ratio improves the performance of a flash memory cell especially during low-voltage operations.

One of the main advantages of the present invention is that, typically, attempts to increase the overlapping area between the control gate and the floating gate would result in an increase in the cell size. With the process disclosed in the present invention, the overlapping area is increased with the penalty of increases in cell size.

The present invention allows the self-alignment of field oxide (FOX) and the floating gates, while retaining or even improving the control-gate-to-floating-gate coupling ratio. The present invention also utilizes a novel fabrication procedure to impart poly spacers to the sides of the floating gates, so as to allow the distance between the pair of floating gates, or the floating-gate-to-floating-gate space, to be shorter than the feature size, i.e., the size is allowed by the underlying photolithography technology. On the one hand, utilization of the self-alignment procedure allows the process of the present invention to be suitable for high density applications. On the other hand, the novel poly spacers provided to the control gate of the flash memory cell of the present invention, coupled with the poly spacers of the floating gates, further increase the overlap area between the control gate and the floating gates. This, as a result, enhances the control-gate-to-floating-gate coupling ratio.

In making the flash memory cell of the present invention, wells are first formed on a substrate using well-known techniques. A tunnel oxide is grown on the substrate, followed by the deposition/doping of a poly-1 layer on the tunnel oxide, and the deposition of a dielectric layer on the poly-1 layer. Finally a thin poly layer is deposited on the dielectric layer. One of the main purposes of depositing the dielectric layer and the thin poly layer is to elevate the height of the poly-1 layer so that a poly sidewall spacer with the desired dimension and shape can be formed on the floating gate, which is to be formed from the poly-1 layer.

After the main portion of the floating gate (i.e., without its sidewall spacers) is defined, a conventional photolithography technology is applied in conjunction with a photoresist, followed by a silicon etch procedure, to etch the portion of the stacked layers above the substrate not covered by the photoresist. The silicon etch procedure also cuts into a finite depth into the substrate to form a recess. Then an oxide layer is formed which fills the recess in the substrate and covers the stacked layers above the substrate. Because of the substantial height relative to the bottom of the recess, the oxide layer is formed by a combination of oxidation, field implant, and chemical vapor deposition (CVD) of oxide, to ensure complete filling and improve process efficiency. The oxide layer is planarized using a chemcial-mechanical polishing (CMP) procedure, using the thin poly layer as the CMP stop.

An oxide etch-back procedure is subsequently applied, to remove part of the oxide layer to the extent that a portion of the poly-1 layer is revealed. Then a poly-2 layer is formed by CVD on the stacked layers on the substrate. The revealed portion of the poly-1 layer formed during the oxide etch-back step allows the poly-2 layer to be merged with the poly-1 layer to form a floating gate. An anisotropic etch is applied to remove the thin poly layer, the dielectric layer, and the poly-2 layer above these layers. The elevated height as a result of the dielectric layer causes a poly sidewall spacer to be formed which is merged into the poly-1 layer. The poly sidewall spacers allow the floating gates to be closer to each other than they would be by conventional photolithography technique. The poly sidewall spacers are formed on a portion of the oxide layer, which become exposed after the anisotropic etching step. In this manner, the present invention causes the oxide layer to be wedged between a pair of neighboring floating gates.

An oxide/nitride/oxide (ONO) layer is formed above the substrate, which now contains the oxide layer wedged between the two spaced floating gates, by deposition or ONO layer growth. The ONO layer follows the profile of the floating gates. Finally, a poly-3 layer is formed, by deposition and doping, above the substrate to form a control gate. The novel process disclosed in the present invention allows the control gate to have a substantially increased overlapping area with the floating gates, and thus a substantially increased control-gate-to-floating-gate coupling ratio.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

Figure 1:
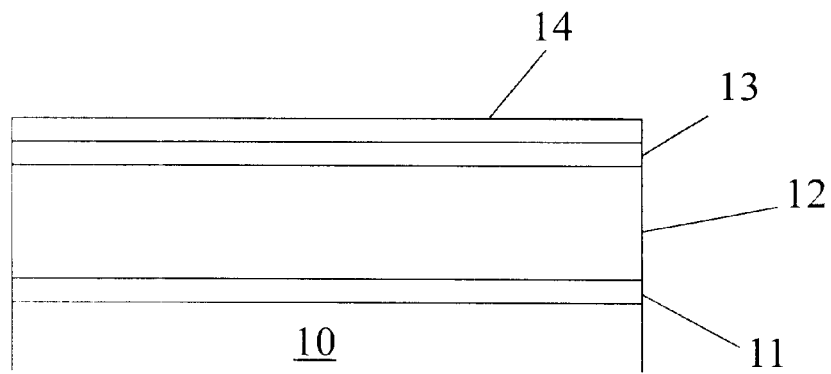
FIG. 1 is a schematic diagram showing that a stacked multilayer is formed on a substrate which comprises, in the order away from the substrate: a tunnel oxide layer, a poly-1 layer, a dielectric layer, and a thin poly layer; the poly-1 layer will ultimately form the main portion of floating gates.

The present invention discloses a novel method to fabricate flash memory cells with improved control-gate-to-floating-gate coupling ratio. The improved flash memory made from the process disclosed in the present invention provides increased overlapping area between control gate and floating gate, thus allowing the control-gate-to-floating-gate coupling ratio and the performance of the flash memory to be enhanced. One of the main advantages of the present invention is that, by using self-alignment of field oxide (FOX) and the floating gates, the overlapping area can be increased without incurring the penalty of increases in cell size. Another advantage of the present invention is that, the distance between the floating gates can be shorter than the feature size, i.e., the size that is allowed by the underlying photolithography technology.

The process disclosed in the present invention can be summarized as comprising the following steps:

(a) Forming a stacked multi-layer on a substrate, the stacked multi-layer comprising, in the order away from the substrate a tunnel oxide layer, a poly-1 layer, a dielectric layer, and a thin poly layer.

(b) Using a photolithography technique to etch the stacked multilayer and the substrate are etched so to form a towering structure surrounded by by a recessed region in the substrate.

(c) Forming a field oxide layer which fills the recessed region and covers the stacked multilayer.

(d) Planarizing the field oxide layer by applying a chemical-mechanical polishing (CMP) procedure, using the thin poly layer as the CMP stop.

(e) Applying an oxide etchback procedure is to the oxide layer to reveal a portion of the poly-1 layer.

(f) Forming a poly-2 layer on top of the substrate which merges with the poly-1 layer through the revealed portion of the poly-1 layer.

(g) Applying an anisotropic etching procedure to remove the dielectric layer, the thin poly layer, and the poly-2 layer on top thereof, wherein the elevated height due to the existence of the dielectric layer and the thin poly layer causes a pair of poly sidewall spacers to remain which are attached to the floating gate and disposed on top of a portion of the field oxide layer. In this manner, the field oxide is self-aligned to, and is wedged between, a pair neighboring but spaced apart floating gates.

(h) Forming an oxide/nitride/oxide (ONO) layer covering the floating gates; and (i) Forming a poly-3 layer on top of the substrate covering both the floating gates and the field oxide layer to form a control gate.

The present invention allows field oxide layer (FOX) to be self-aligned with the floating gates, while retaining or even improving the control-gate-to-floating-gate coupling ratio. As described above, the novel fabrication procedure of the present invention imparts a pair of poly sidewall spacers to the floating gates, so as to allow the floating-gate-to-floating-gate space to be shorter than the feature size, i.e., the size is allowed by the underlying photolithography technology. Furthermore, the portion of the control gate above the poly sidewall spacers of the floating gates causes the area of overlap between the control gate and the floating gates to be substantially increased. This, as a result, enhances the control-gate-to-floating-gate coupling ratio.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIG. 1 is a schematic diagram showing that a stacked multilayer 10 was formed on a substrate 1. The stacked multilayer 10 comprised, in the order away from the substrate: a tunnel oxide layer 11, a poly-1 layer 12, a dielectric layer 13, and a thin poly layer 14. The poly-1 layer 12 would ultimately form the main portion of the floating gates. The tunnel oxide layer 11 was formed by oxide growth, the poly-1 layer 12 was formed by CVD deposition and doping, the dielectric layer 13 was formed by deposition, and the thin poly layer 14 was also formed by deposition. The dielectric layer 13 colud also be formed by oxide/nitride growth. These steps used well known techniques and hence are not discussed in detail here.

Figure 2:
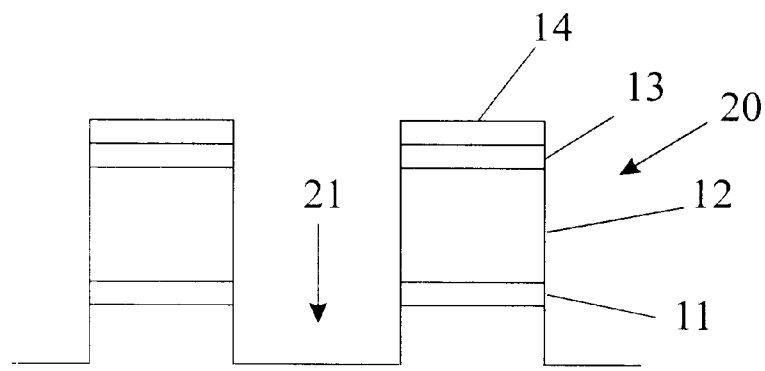
FIG. 2 is a schematic diagram showing that the stacked multilayer and the silicon-based substrate are etched to form a towering structure adjoined by a recess in the substrate.
Figure 3:
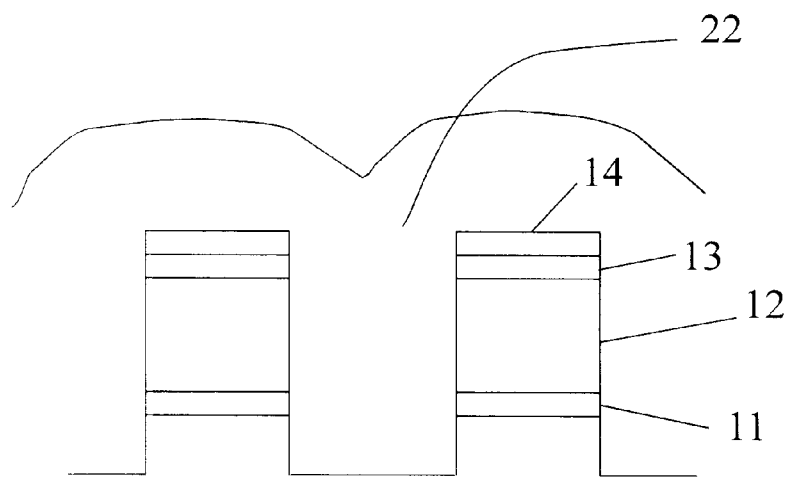
FIG. 3 is a schematic diagram showing that an oxide layer is formed, by the combined steps of oxidation, field implant, and CVD oxide deposition, filling the recess and covering the stacked multilayer.

FIG. 2 is a schematic diagram showing that the stacked multilayer 10 and the silicon-based substrate 1 were etched to form a towering structure 20 surrounded by a recess, or trench, 21, formed in the substrate 1. FIG. 3 is a schematic diagram showing that a field oxide layer 22 was formed to fill the recess and cover the stacked multilayer. Because of the relatively large depth of the recess relative to the towering structure 20, the field oxide layer was formed by the combined steps of oxidation, field implant, and CVD oxide deposition.

Figure 4:
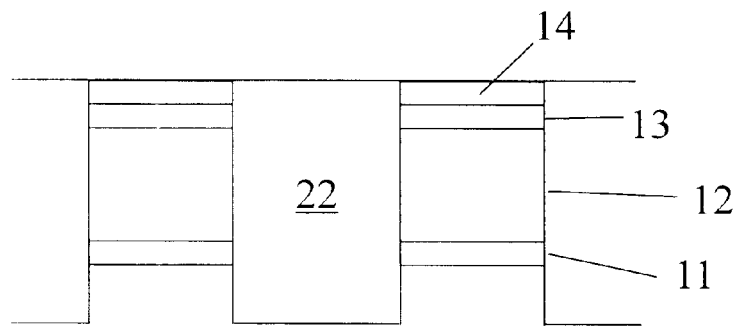
FIG. 4 is a schematic diagram showing that the oxide layer is planarized by a chemical-mechanical polishing (CMP) procedure, using the thin poly layer as a CMP stop.

FIG. 4 is a schematic diagram showing that the field oxide layer 22 was planarized by a chemical-mechanical polishing (CMP) procedure, using the thin poly layer 14 as a CMP stop.

Figure 5:
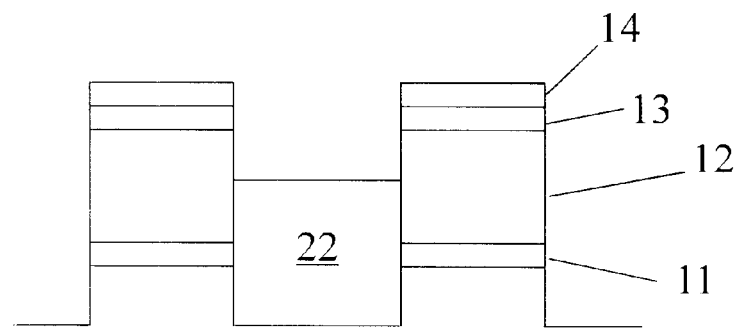
FIG. 5 is a schematic diagram showing that an oxide etchback procedure is applied to the oxide layer to reveal a portion of the poly-1 layer.
Figure 6:
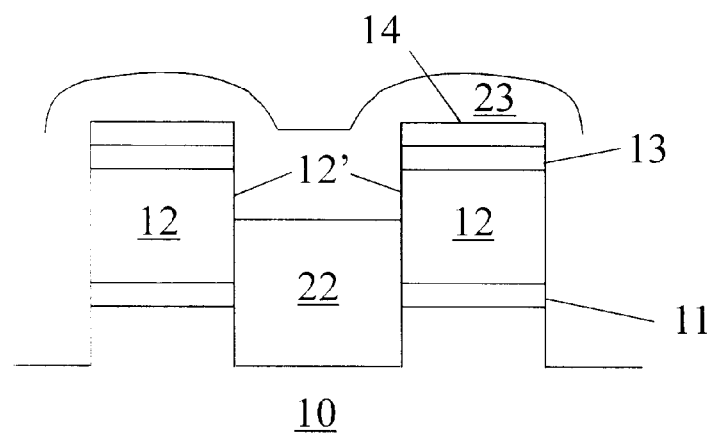
FIG. 6 is a schematic diagram showing that a poly-2 layer is formed on top of the substrate wherein the revealed portion of the poly-1 layer allows the poly-2 layer to be merged with the poly-1 layer.

FIG. 5 is a schematic diagram showing that an oxide etch-back procedure was applied to the field oxide layer 22 to reveal a portion of the poly-1 layer 12. Preferably, the field oxide layer 22 covered about ⅓ to ½ of the poly-1 layer 12. Thereafter, a poly-2 layer 23 was formed on top of the substrate using CVD deposition and doping, as shown in FIG. 6. FIG. 6 also shows that the revealed portion of the poly-1 layer 12' allowed the poly-2 layer 23 to be merged with the poly-1 layer 12.

Figure 7:
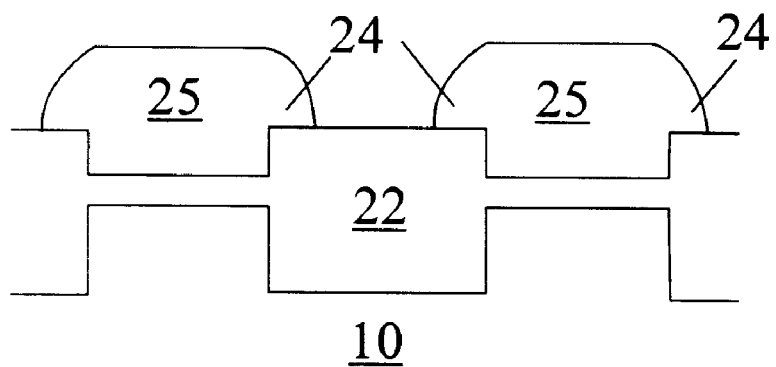
FIG. 7 is a schematic diagram showing the removal of the dielectric layer and the thin poly layer, and the formation of poly sidewall spacers, after the application of an anisotropic etching procedure, to form a pair of floating gates wedged therebetween with the oxide layer.
Figure 8:
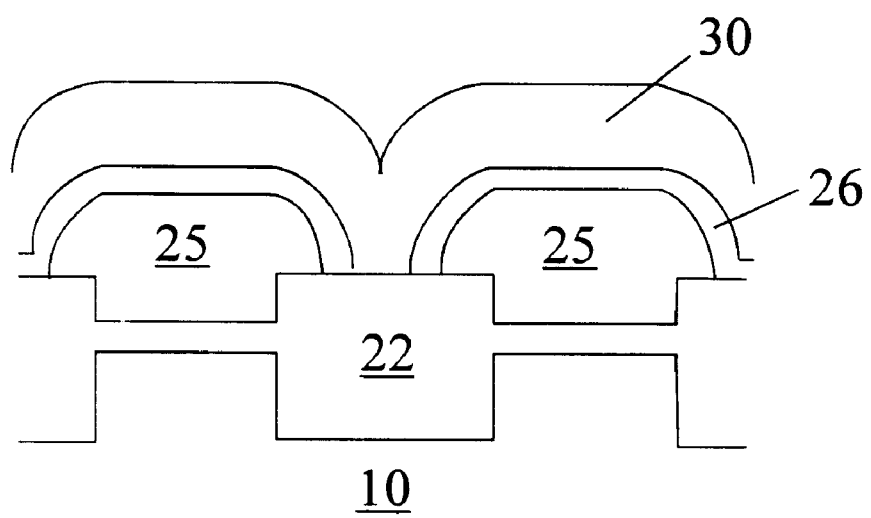
FIG. 8 is a schematic diagram showing that a poly-3 layer is formed, after an oxide/nitride/oxide (ONO) layer is formed on the floating gates, on top of the substrate covering the floating gate and the oxide layer.

FIG. 7 is a schematic diagram showing the removal of the dielectric layer, the thin poly layer, and the poly-2 layer on top thereof, by the application of an anisotropic etching procedure. As a result of the elevated height provided by the dielectric layer and, to a less extent, the thin poly layer, a pair of poly sidewall spacers 24 were left, after the anisotropic etch, on the sides of the remaining poly-1 layer, to form into a floating gate 25. Because the poly sidewall spacers 24 were formed on the top of the field oxide layer, 22, FIG. 7 shows that the field oxide layer 22 as being wedged between a pair of neighboring floating gates 25.

Finally, an oxide/nitride/oxide (ONO) layer 26 was formed on the floating gates 25 by CVD deposition. The ONO layer can also be formed by ONO growth. Finally, a poly-3 layer 30 was formed, by deposition and doping, on top of the ONO layer covering the floating gate and the oxide layer. This poly-3 layer 30 was patterned to form a control gate.

The poly sidewall spacers which became a part of the floating gate substantially increased the overlapping area between the control gate and the floating gate, thus allowing the control-gate-to-floating-gate coupling ratio and the performance of the flash memory to be enhanced. Also, since the field oxide (FOX) and the floating gates are self-aligned, the process disclosed in the present invention is most advantageous for use in making high density flash memories for low-voltage applications. Furthermore, with the present invention, the distance between the floating gates of can be shorter than the feature size, improved flash memory cells can be fabricated using currently available photolithography technology.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabrication flash memories with high control-gate-to-floating-gate coupling ratio comprising the following steps:

(a) forming a stacked multi-layer on a substrate, said stacked multi-layer comprising, in said order away from said substrate, a tunnel oxide layer, a poly-1 layer, a dielectric layer, and a thin poly layer;

(b) using a photolithography technique and a silicon etching procedure to etch said stacked multilayer and said substrate so as to form a towering structure surrounded by by a recessed region in said substrate;

(c) forming a field oxide layer (FOX) which fills said recessed region and covers said stacked multilayer;

(d) planarizing said field oxide layer by applying a chemical-mechanical polishing (CMP) procedure, using said thin poly layer as a CMP stop;

(e) applying an oxide etchback procedure to said field oxide layer to reveal a portion of said poly-1 layer;

(f) forming a poly-2 layer on top of said field oxide and said stacked multilayer wherein said poly-2 layer is merged with said poly-1 layer through said revealed portion of said poly-1 layer;

(g) applying an anisotropic etching procedure to remove said dielectric layer, said thin poly layer, and a portion of said poly-2 layer on top thereof, wherein an elevated height due to said dielectric layer and said thin poly layer causes a pair of poly sidewall spacers to remain which are attached to said poly-1 layer to jointly form a floating gate;

(h) forming an oxide/nitride/oxide (ONO) layer covering said floating gates; and (i) forming a poly-3 layer on top of said substrate covering both said floating gates and said field oxide layer to form a control gate.

2. The method for fabrication flash memories with high control-gate-to-floating-gate coupling ratio according to claim 1 which further comprises the step of doping said substrate to form an N-well or P-well before the formation of said stacked multilayer.

3. The method for fabrication flash memories with high control-gate-to-floating-gate coupling ratio according to claim 1 wherein said poly-1, poly-2, and poly-3 layers are formed by chemical vapor deposition (CVD) and doping.

4. The method for fabrication flash memories with high control-gate-to-floating-gate coupling ratio according to claim 1 wherein said field oxide layer is formed by chemical vapor deposition.

5. The method for fabrication flash memories with high control-gate-to-floating-gate coupling ratio according to claim 1 wherein said field oxide layer is formed by oxide growth.

6. The method for fabrication flash memories with high control-gate-to-floating-gate coupling ratio according to claim 1 wherein said oxide/nitride/oxide (ONO) layer is formed by chemical vapor deposition.

7. The method for fabrication flash memories with high control-gate-to-floating-gate coupling ratio according to claim 1 wherein said oxide/nitride/oxide (ONO) layer is formed by oxide/nitride/oxide growth.

8. The method for fabrication flash memories with high control-gate-to-floating-gate coupling ratio according to claim 1 wherein said field oxide layer is formed by oxidation, field implantation, and chemical vapor deposition.

9. A flash memory with a high control-gate-to-floating-gate coupling ratio which is fabricated by a process comprising the steps of:

(a) forming a stacked multi-layer on a substrate, said stacked multi-layer comprising, in said order away from said substrate, a tunnel oxide layer, a poly-1 layer, a dielectric layer, and a thin poly layer;

(b) using a photolithography technique and a silicon etching procedure to etch said stacked multilayer and said substrate so as to form a towering structure surrounded by by a recessed region in said substrate;

(c) forming a field oxide layer (FOX) which fills said recessed region and covers said stacked multilayer;

(d) planarizing said field oxide layer by applying a chemical-mechanical polishing (CMP) procedure, using said thin poly layer as a CMP stop;

(e) applying an oxide etchback procedure to said field oxide layer to reveal a portion of said poly-1 layer;

(f) forming a poly-2 layer on top of said field oxide and said stacked multilayer wherein said poly-2 layer is merged with said poly-1 layer through said revealed portion of said poly-1 layer;

(g) applying an anisotropic etching procedure to remove said dielectric layer, said thin poly layer, and said poly-2 layer on top thereof, wherein an elevated height due to said dielectric layer and said thin poly layer causes a pair of poly sidewall spacers to remain which are attached to said poly-1 layer to jointly form a floating gate;

(h) forming an oxide/nitride/oxide (ONO) layer covering said floating gates; and (i) forming a poly-3 layer on top of said substrate covering both said floating gates and said field oxide layer to form a control gate.

10. The flash memory with a high control-gate-to-floating-gate coupling ratio according to claim 9 wherein said process further comprises the step of doping said substrate to form an N-well or P-well before the formation of said stacked multilayer.

11. The flash memory with a high control-gate-to-floating-gate coupling ratio according to claim 9 wherein said poly-1, poly-2, and poly-3 layers are formed by chemical vapor deposition (CVD) and doping.

12. The flash memory with a high control-gate-to-floating-gate coupling ratio according to claim 9 wherein said field oxide layer is formed by chemical vapor deposition.

13. The flash memory with a high control-gate-to-floating-gate coupling ratio according to claim 9 wherein said field oxide layer is formed by oxide growth.

14. The flash memory with a high control-gate-to-floating-gate coupling ratio according to claim 9 wherein said oxide/nitride/oxide (ONO) layer is formed by chemical vapor deposition.

15. The flash memory with a high control-gate-to-floating-gate coupling ratio according to claim 9 wherein said oxide/nitride/oxide (ONO) layer is formed by oxide/nitride/oxide growth.

16. The flash memory with a high control-gate-to-floating-gate coupling ratio according to claim 9 wherein said field oxide layer is formed by oxidation, field implantation, and chemical vapor deposition.

* * * * *